(12) United States Patent
Choi et al.

(10) Patent No.: US 7,227,878 B1
(45) Date of Patent: Jun. 5, 2007

(54) DIFFERENTIAL OPTO-ELECTRONICS TRANSMITTER

(75) Inventors: Lawrence Choi, Downey, CA (US); Weimin Sun, Thousand Oaks, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 11/330,497

(22) Filed: Jan. 11, 2006

Related U.S. Application Data

(63) Continuation of application No. 10/422,364, filed on Apr. 23, 2003, now abandoned.

(60) Provisional application No. 60/375,170, filed on Apr. 23, 2002.

(51) Int. Cl.
*H01S 3/10* (2006.01)
*H01S 3/00* (2006.01)

(52) U.S. Cl. ............... 372/38.02; 372/38.1; 372/26

(58) Field of Classification Search ........... 372/38.1, 372/38.02
See application file for complete search history.

(56) References Cited

U.S. PATENT DOCUMENTS

| | | | |
|---|---|---|---|
| 6,552,837 B2 | 4/2003 | Mirshekar-Syahkal et al. | |
| 6,587,249 B2 | 7/2003 | Henry | |
| 6,618,408 B1 | 9/2003 | Mader et al. | |
| 6,667,661 B1 | 12/2003 | Liu et al. | |
| 6,738,173 B2 | 5/2004 | Bonthron et al. | |

OTHER PUBLICATIONS

MAX3941 Dat Sheet, "Maxim 10 Gbps EAM Driver With Integrated Bias Network", Maxim Integrated Products, Jul. 2003, (11pgs.).

Mindspeed Data Sheet, "MO2169 - 5.2 or +5.0 Volt EAM and DML Driver IC for Applications to 10.7 Gbps", Mindspeed Technologies, Jan. 2004, (36 pgs.).

Max3935 Data Sheet, "Maxim 10.7Gbps EAM Driver", Maxim Integrated Products, May 2003, (14 pgs.).

*Primary Examiner*—Armando Rodriguez
(74) *Attorney, Agent, or Firm*—Christie, Parker & Hale, LLP

(57) ABSTRACT

A system and method for biasing the outputs of a laser modulator driver while allowing for high speed operation. A differential amplifier type modulator driver is provided which uses a reduced number of components in the high speed path. Additionally, the modulator driver may be constructed with a distributed output stage.

3 Claims, 3 Drawing Sheets

DIFFERENTIAL OPTO-ELECTRONICS TRANSMITTER

CROSS-REFERENCE TO RELATED APPLICATIONS

This application is a continuation of patent application Ser. No. 10/422,364, filed Apr. 23, 2003, now abandoned which claims the benefit of U.S. provisional Application No. 60/375,170, filed Apr. 23, 2002, titled Differential Opto-Electronics Transmitter, which is hereby incorporated by reference as if set forth in full herein.

BACKGROUND OF THE INVENTION

This invention relates generally to laser modulator drivers, and more specifically to biasing the outputs of a laser modulator driver with a nearly constant output impedance.

High speed optical transmission networks often rely on pulses of light in order to transmit data. Lasers are often used to provide a light source. Rather than modulating the laser itself, a separate modulator is sometimes used. The laser is operated in continuous wave mode and the laser light is then passed into a modulator. The modulator varies the amount of light provided to an output in order to generate the pulses of light.

Modulator drivers generally provide a large voltage swing to a laser modulator in order to turn the modulator on and off completely. However, laser modulators often introduce undesirable frequency modulation, or chirp, into the output signal. In order to reduce the amount of chirp, a bias voltage is usually applied to the laser modulator. The bias voltage is often applied on top of the modulation voltage. That is, the bias voltage serves as a DC offset for the modulation voltage.

In many cases the bias voltage is applied to an output of the modulator driver. However, this may introduce additional components in a high speed path. The additional components in the high speed path often limit the maximum speed at which the modulator can operate. Additionally, bias components coupled to the output of a modulator driver often introduce parasitics, such as capacitance, to the output of the modulator driver. These parasitics often degrade the output parameters of the modulator.

SUMMARY OF THE INVENTION

In one aspect, the invention provides a laser modulator driver comprising a differential amplifier circuit generating differential output signals in response to differential input signals; a modulation current source transistor coupling a first node of the differential amplifier to a first voltage, the modulation transistor receiving a modulation signal; a bias transistor coupling a second node of the differential amplifier circuit to a second voltage; and an operational amplifier having a first input coupled to the second node of the differential amplifier circuit, the operational amplifier receiving at a second input a bias signal, the operational amplifier having an output coupled to a gate of the bias transistor.

In another aspect, the invention provides a laser modulator driver comprising a differential amplifier generating a differential output signal in response to a differential input signal on differential input signal lines, the differential input signal lines being coupled by a pair of bridging resistors coupled in series; an operational amplifier having a first input coupled to a first node of the differential amplifier, the operational amplifier receiving at a second input a control signal, the operational amplifier having an output coupled to a node between the bridging resistors.

In another aspect, the invention provides a laser modulator driver comprising an output stage containing differential input signal lines and differential output signal lines; the output stage including a plurality of further output stages, the further output stages operating in parallel; the further output stages each containing at least one input, with the inputs of the further output stages being coupled together via a series of input transmission lines; and the further output stages each containing at least one output, with the outputs of the further output stages being coupled together via a series of output transmission lines.

In another aspect, the invention provides a method of generating a laser modulator signal, comprising receiving a modulator input signal; amplifying the modulator input signal in an amplifier circuit to form a modulator output signal; limiting the maximum voltage of the modulator output signal in response to a received limiting signal; comparing the voltage at a desired point in the amplifier circuit with a bias voltage; biasing the modulator output signal in response to the comparison of the voltage at the desired point with the bias voltage.

In another aspect, the invention provides a method of generating a laser modulator signal, comprising receiving a modulator input signal; providing the modulator input signal to a plurality of output stages via a plurality of input transmission lines; amplifying the modulator input signal to provide a modulator output signal; providing the modulator output signal to an output port via a plurality of output transmission lines.

In another aspect, the invention provides a differential signal driver for a laser modulator, comprising a differential amplifier receiving a differential input signal at a differential input, and providing a differential output signal at a differential output; an adjustable bias level adjuster including a variable resistance coupled to the differential output and providing current to the differential amplifier; and a modulator current source pulling current from the differential amplifier.

In another aspect, the invention provides a differential signal driver for a laser modulator, comprising a differential amplifier receiving differential inputs and providing differential outputs; a modulation current source for the differential amplifier; and a common mode adjustment circuit coupled between the differential inputs and the modulation current source.

These and other aspects of the invention will be more readily understood upon review of the following description and the accompanying figures.

DETAILED DESCRIPTION

Figure 1:
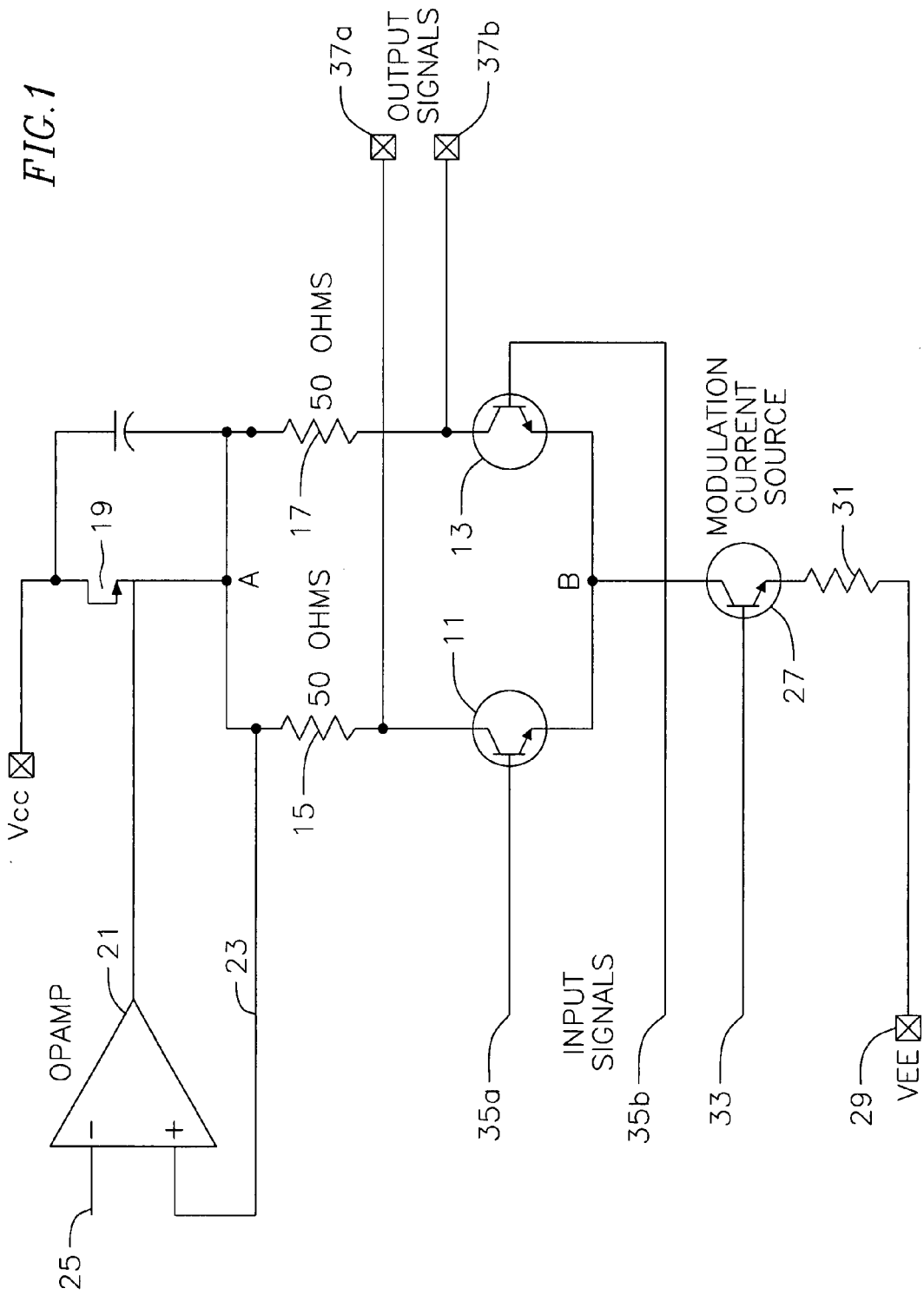
FIG. 1 illustrates an embodiment of the current invention utilizing a PFET transistor and an on die operational amplifier to regulate the laser modulator bias voltage.

FIG. 1 illustrates an embodiment of the invention in accordance with aspects of the present invention. In FIG. 1 a laser modulator driver circuit includes a differential amplifier circuit receiving differential input signals 35a,b and providing differential modulation outputs 37a,b the differential amplifier circuit includes amplifier transistors 11 and 13. The differential input signals are provided to the bases of transistors 11 and 13, respectively. Differential modulation outputs 37a,b are taken from collectors of transistors 11 and 13 respectively. Emitters of transistors 11 and 13 are coupled together at a node B, which may be considered a first node of the differential amplifier circuit.

A collector of a modulation current source transistor 27 is tied to node B. The emitter of the modulation current source transistor is coupled to a first terminal of a current limiting resistor 31. The current limiting resistor has a second terminal tied to $V_{EE}$ 29, which may be considered a first voltage. The modulation current source transistor receives at its base a modulation signal 33. The modulation signal sets the maximum voltage of the output of the circuit.

The collector of transistor 11 is coupled to a first terminal of a resistor 15. Similarly, the collector of transistor 13 is coupled to a first terminal of a resistor 17. Second terminals of resistors 15 and 17 are coupled together at a node A, which may be considered a second node of the differential amplifier circuit. Node A is in turn coupled to the drain of a bias transistor 19. In one embodiment, the bias transistor is a PFET transistor. The source of the bias transistor is coupled to $V_{CC}$, which may be considered a second voltage. The base of the bias transistor receives a signal from an operation amplifier 21. The operation amplifier has a first input 23, its non-inverting input as illustrated in FIG. 1, coupled to node A. The operation amplifier receives a bias signal at its other input 25, a second or inverting input as illustrated in FIG. 1. The output of the operational amplifier is provided to the gate of the bias transistor. Adjusting the output of the operational amplifier varies the resistance of the bias transistor.

In operation, differential input signals are provided to the bases of the amplifier transistors via input signal lines 35a,b. The differential amplifier amplifies the differential input signals. When transistor 11 receives a positive voltage at its base, it allows current to flow. As amplifier transistor 11 is in series with resistor 15, the same current flows through resistor 15. The current flowing through resistor 15 creates a voltage drop across the resistor. By varying the flow of current, the voltage drop across resistor 15 is varied. As an output 37a output of the modulator driver is taken from the collector of amplifier transistor 11, the output voltage on the output 37a is also varied. Amplifier transistor 13, in conjunction with resistor 17 and output 37b, operate in an analogous manner. Thus, the voltage amplified versions of the modulation input signals are provided at the modulation outputs.

The modulation signal applied to the modulation current source transistor sets the maximum amount of current that may be drawn by the differential amplifier. As resistor 31 is in series with the modulation current source transistor, the maximum current that may pass through resistor 31 is limited. In turn, the maximum current sets the maximum voltage drop across resistor 31. The modulation outputs are therefore adjustably limited to a maximum voltage. The maximum voltage is determined by the value of resistor 31, the power supply voltages, the signal supplied to the base of limiting transistor 27, and the characteristics of the amplifier transistors.

The non-inverting input of the operational amplifier is coupled to node A, and accordingly, the operational amplifier compares the voltage at node A to the bias signal the operational amplifier receives at its inverting input. The operational amplifier produces a difference signal at its output 21 in response to the difference between the bias signal and the voltage at node A. The difference signal is provided to the gate of the bias transistor. In one embodiment, the bias transistor operates in its linear range. Thus, the bias transistor 19 may be thought of as a variable resistor. As the effective resistance of the bias transistor is varied, the voltage drop across the bias transistor is also varied. Thus, node A is adjustably biased between $V_{CC}$ and $V_{EE}$ at a bias voltage. The bias voltage is determined by the characteristics of the bias transistor, the current flowing through the bias transistor, and the bias signal received by the operational amplifier. The current flowing in the bias transistor is primarily the current generated by the modulation current source. The current flows through transistor 11 or transistor 13, depending on the state at the complementary input signals. Consequently, the differential modulation outputs are adjustably biased between $V_{CC}$ and a bias level. In this way, the voltage that the output signals may obtain is bounded by a maximum and minimum voltage, with the maximum voltage set by the modulation signal and the minimum voltage set by the bias signal.

Figure 2:
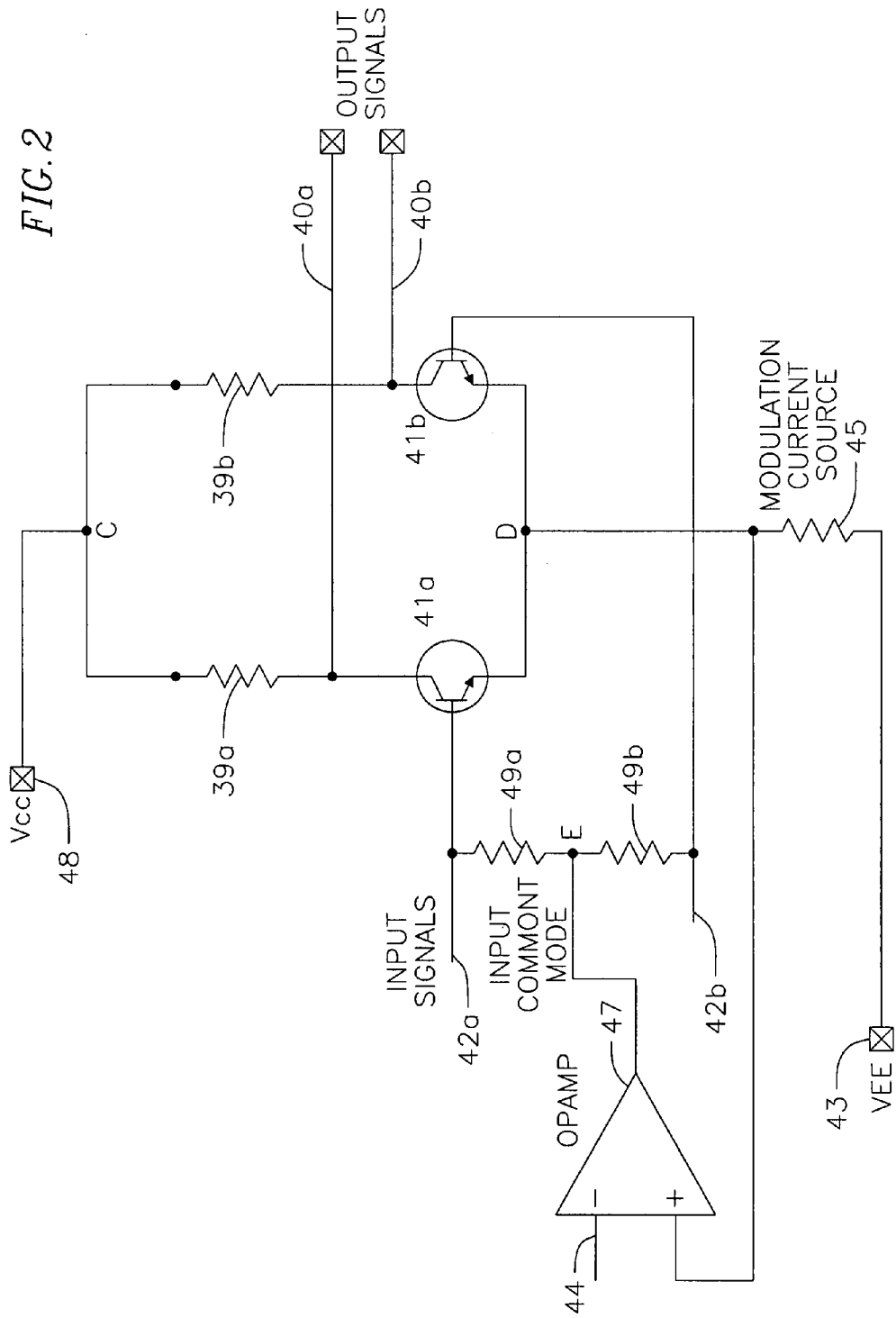
FIG. 2 illustrates the use of an operational amplifier to control the current flowing through the laser modulator by setting the common mode voltage of switching transistors.

FIG. 2 illustrates an alternate embodiment in accordance with aspects of the present invention. In FIG. 2, resistors 39a and 39b have a first terminal tied together at node C. Node C is also coupled to $V_{CC}$ 48. A second terminal of resistor 39a is coupled to the collector of transistor 41a. Similarly, a second terminal of resistor 39b is coupled to the collector of transistor 41b. Emitters of input transistors 41a,b are coupled together at node D. Node D is tied to $V_{EE}$ 43 via a resistor 45. Input transistors 41a,b receive at their bases differential input signals, on differential input signal lines 42a,b. Thus, resistors 39a,b and input transistors 41a,b form a differential amplifier.

The differential input signal lines are coupled by series coupled bridging resistors 49a,b. Thus, the common mode level of the differential input signals is the voltage at a node between the bridging resistors, with the node being node E as illustrated in FIG. 2. A first terminal of an input resistor 49a is coupled to the base of input transistor 41a. A first terminal of an input resistor 49b is coupled to the base of input transistor 41b. The second terminals of the input resistors are tied together at node E. Operational amplifier 47 has its inverting input coupled to node D. The operational amplifier receives a bias signal at its noninverting input 49. The output of the operation amplifier is provided to node E.

In operation, modulation input signals are applied to the bases of input transistors 41a,b. The differential amplifier amplifies the modulation input signals. When input transistor 41a receives a positive voltage at its base, it allows current to flow. As input transistor 41a is in series with resistor 39a, the same current flows through resistor 39a. The current flowing through resistor 39a creates a voltage drop across the resistor. By varying the flow of current, the voltage drop across resistor 39a is varied. As an output 40a of the modulator driver is taken from the collector of input transistor 41a, the output voltage on the output 40a is also varied. Input transistor 41b, in conjunction with resistor 39b and output 40b, operate in an analogous manner. Thus, the voltage amplified versions of the modulation input signals are provided at the modulation outputs 40a,b.

The operational amplifier compares the voltage at node D with the control signal the operational amplifier receives at its noninverting input 44. The operational amplifier outputs a signal in response to the difference between the control signal and the voltage at node D. The output of the operational amplifier is coupled to Node E, and sets the common mode level of the inputs to the transistors 41a, 41b. Thus, the feedback generated by the operational amplifier serves to drive node D to a desired voltage by adjusting the common mode of the input differential signals. The voltage at node D determines the voltage drop across resistor 45. The voltage drop across resistor 45 limits the maximum voltage that the output signals may achieve.

To ensure maximum coupling between the modulator and the modulator driver, the impedances of the modulator and modulator driver are generally matched. That is, the input impedance of the modulator is generally the same as the output impedance of the modulator driver, over a specified range. However, the intrinsic capacitance of the output transistors of the modulator driver often degrades the impedance matching, especially at high frequencies. Consequently, the performance of the modulator driver is often compromised at high frequencies.

Figure 3:
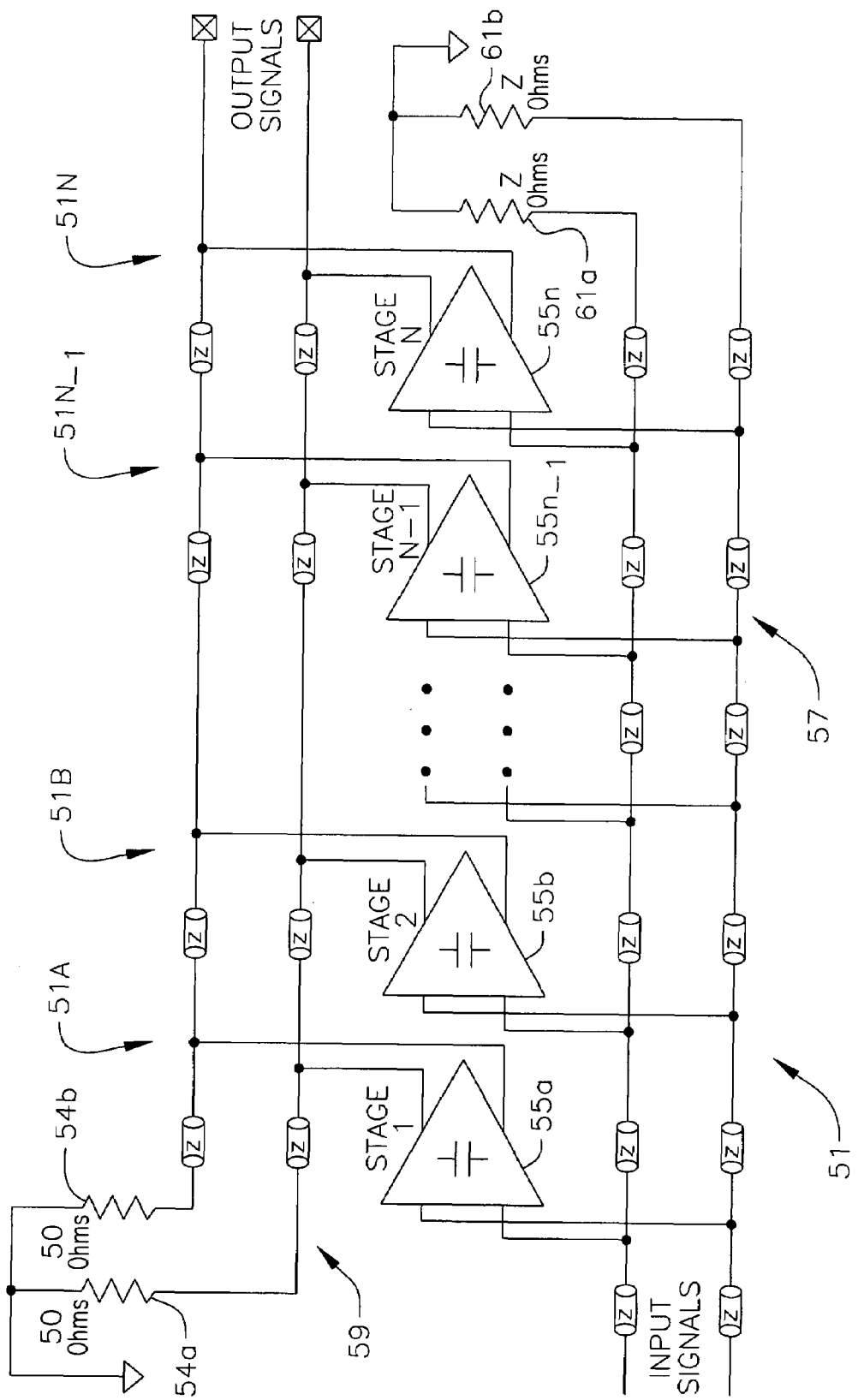
FIG. 3 illustrates a laser modulator utilizing a plurality of distributed differential output stages.

FIG. 3 illustrates a differential output stage of a modulator driver 51 that has been separated into N differential distributed output stages 51A–N. Each of the distributed output stages include a differential amplifier 55a–n. In some embodiments the differential amplifiers are distributed in space on a die or other semiconductor device to minimize heating between differential amplifiers.

The differential amplifiers receive an input differential signal on a differential input line 57, and provide an output differential signal on a differential output line 59. Both the differential input line and the differential output line are controlled impedance lines, with the differential input lines coupled to ground by input termination resistors 61a,b and the differential output lines coupled to ground by output termination resistors 54a,b.

Each transmission line has an associated capacitance and inductance. The inductance of the output transmission lines serves to isolate the modulator from the intrinsic capacitance of the output transistors at each stage of the modulator driver. In some embodiments the length between stages and inductive characteristics of the differential output line is selected to effectively cancel the capacitive effects of the transistors of each differential amplifier. The capacitive effects of the output transistors increase with increasing frequency. However, as the operating frequency increases, the inductance of the transmission lines provides increased isolation of the output transistors and the laser modulator. Thus, the output impedance of the modulator driver is nearly constant over its operating range.

Accordingly, the present invention provides a system and method for biasing a laser modulator driver with nearly constant output impedance. Although this invention has been described in certain specific embodiments, it is to be understood that this invention may be practiced otherwise than as specifically described without departing from the scope and spirit of the invention as set forth in the claims and their equivalents.

What is claimed is:

1. A differential signal driver for a laser modulator, comprising:
    a differential amplifier receiving differential inputs and providing differential outputs;
    a modulation current source for the differential amplifier; and
    a common mode adjustment circuit coupled between the differential inputs and the modulation current source.

2. The differential signal driver for a laser modulator of claim 1 wherein the common mode adjustment circuit comprises a pair of bridging resistors coupled in series coupling the differential inputs and an operational amplifier having a first input coupled to a first node of the differential amplifier, the operational amplifier receiving at a second input a control signal, the operational amplifier having an output coupled to a node between the bridging resistors.

3. The laser modulator driver of claim 2 wherein the second input of the operation amplifier is a non-inverting input coupled to the first node of the differential amplifier.

* * * * *